United States Patent
Jiang et al.

(10) Patent No.: US 12,278,485 B1
(45) Date of Patent: Apr. 15, 2025

(54) DISTRIBUTED CAPACITANCE ENERGY ABSORPTION VERIFICATION DEVICE

(71) Applicant: Hefei Institutes of Physical Sciences, Chinese Academy of Sciences, Anhui (CN)

(72) Inventors: CaiChao Jiang, Anhui (CN); Bo Liu, Anhui (CN); ZhiMin Liu, Anhui (CN); ShiYong Chen, Anhui (CN); JunJun Pan, Anhui (CN); Sheng Liu, Anhui (CN); YuanLai Xie, Anhui (CN)

(73) Assignee: Hefei Institutes of Physical Sciences, Chinese Academy of Sciences, Hefei (CN)

( * ) Notice: Subject to any disclaimer, the term of this patent is extended or adjusted under 35 U.S.C. 154(b) by 0 days.

(21) Appl. No.: 18/946,768

(22) Filed: Nov. 13, 2024

(30) Foreign Application Priority Data

May 8, 2024 (CN) .......................... 202410562273.9

(51) Int. Cl.
*H02H 9/04* (2006.01)
*H02J 7/34* (2006.01)

(52) U.S. Cl.
CPC ................ *H02H 9/04* (2013.01); *H02J 7/345* (2013.01); *H02J 2207/50* (2020.01)

(58) Field of Classification Search
CPC .............................. H02H 9/04; H02J 2207/50
USPC ........................................................ 307/109
See application file for complete search history.

(56) References Cited

U.S. PATENT DOCUMENTS

| 2007/0024123 | A1* | 2/2007 | Pisasal | G11C 5/147 307/109 |
| 2014/0334195 | A1* | 11/2014 | Nussbaum | H02M 3/3378 363/21.04 |
| 2016/0164309 | A1* | 6/2016 | Bonafe' | B60L 3/0046 320/167 |

* cited by examiner

*Primary Examiner* — Daniel Cavallari
*Assistant Examiner* — Swarna N Chowdhuri
(74) *Attorney, Agent, or Firm* — Seed IP Law Group LLP

(57) ABSTRACT

The present disclosure discloses a distributed capacitance energy absorption verification device, which belongs to the field of direct-current high-voltage surge suppression. The distributed capacitance energy absorption verification device mainly includes a direct-current high-voltage generator, a high-voltage switch, a high-voltage capacitor bank, an isolation transformer, an energy absorption device, a high-voltage sphere gap short-circuit switch and other components. The high-voltage capacitor bank is used for simulating a distributed capacitance, and the high-voltage sphere gap short-circuit switch is used for simulating a short-circuit fault of a direct-current high-voltage system, thereby implementing performance verification of the energy absorption device. The present disclosure has the advantages of accurate and adjustable verification voltage, adjustable pulse capacitor bank capacity, quantitative analysis and the like, and is a reliable device for performance evaluation in the design and manufacturing process of the distributed capacitance energy absorption device.

4 Claims, 1 Drawing Sheet

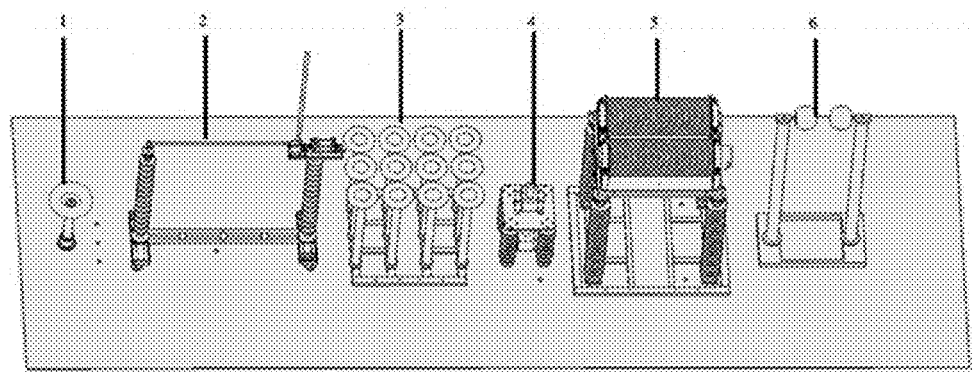

DISTRIBUTED CAPACITANCE ENERGY ABSORPTION VERIFICATION DEVICE

TECHNICAL FIELD

The present disclosure belongs to the field of direct-current high-voltage surge suppression, and more particularly, relates to a distributed capacitance energy absorption verification device, in which a high-voltage capacitor bank is used for simulating a distributed capacitance, and a working performance of energy absorption equipment is verified through short-circuit discharge of a high-voltage capacitor.

BACKGROUND ART

In a large electrical system, especially an accelerator system, due to large size of its electrical equipment at different potentials, a relatively large system distributed capacitance will be formed, which will store energy. In the event of high-voltage fault protection of the system, the energy of the distributed capacitance cannot be released in time, which will cause damage to its core equipment (such as electrodes of an accelerator), so in such a system, there will be equipment for distributed capacitance energy absorption, such as a current-limiting reactor or a snubber. At present, similar verification equipment usually adopts a general-purpose test platform, or a device to be verified is installed directly under actual working conditions for testing, but the test process lacks pertinence and the structure is complex, so detailed test and research on performances of a distributed capacitance energy absorption device cannot be performed, nor can it implement the quick disassembly and assembly of a capacitor bank and the rapid adjustment of high voltage.

BRIEF SUMMARY

The present disclosure may verify distributed capacitance energy absorption equipment and quantitatively evaluate its absorption of distributed capacitance energy. The present disclosure provides a distributed capacitance energy absorption verification device, in which a high-voltage capacitor bank is used for simulating a distributed capacitance, an ignition fault of a direct-current high-voltage system is simulated under the trigger of a high-voltage sphere gap short-circuit switch, and the performances of an energy absorption device are quantitatively evaluated on the basis of ignition currents and voltages in the case of serial connection or not serial connection with a distributed capacitance energy absorption device.

The present disclosure adopts the following technical solution.

A distributed capacitance energy absorption verification device includes a direct-current high-voltage generator, a high-voltage switch, a high-voltage capacitor bank, an isolation transformer, an energy absorption device, and a high-voltage sphere gap short-circuit switch, wherein the direct-current high-voltage generator charges the high-voltage capacitor bank through the high-voltage switch and stores electrical energy, and at this time, positive electrode potentials of the high-voltage switch, the high-voltage capacitor bank, a secondary side of the isolation transformer, the energy absorption device and the high-voltage sphere gap short-circuit switch are consistent with that of the direct-current high-voltage generator. When the high-voltage capacitor is charged to the same level as a test voltage, the high-voltage switch is disconnected, such that the direct-current high-voltage generator is disconnected from a main circuit, and the high-voltage sphere gap short-circuit switch is triggered; at this time, the short-circuit current starts from a positive electrode of a pulse capacitor of the high-voltage capacitor bank, flows through the energy absorption device, and returns to a negative electrode of the high-voltage capacitor bank through the high-voltage sphere gap short-circuit switch, and the energy stored in the high-voltage capacitor bank is released. Finally, the energy absorption device is dismantled or short-circuited to repeat charging and discharging processes of the high-voltage capacitor bank, and short-circuit currents in the case of serial connection or not serial connection with the energy absorption device are compared, thereby implementing the verification of distributed capacitance energy absorption.

Further, the distributed capacitance energy absorption verification device is applicable to the distributed capacitance energy absorption verification under a direct-current high-voltage state, and a direct-current high voltage applied to the distributed capacitance energy absorption verification device is a positive high voltage or negative high voltage.

Further, a distributed capacitance energy absorption device to be verified is a direct-current reactor or a snubber.

Further, the high-voltage capacitor bank includes a detachable or adjustable pulse high-voltage capacitor for adapting a distributed capacitance of a simulated system.

The present disclosure has the following beneficial effects.

The test process of the present disclosure has pertinence and a simple structure, can perform detailed test and research on the performances of the distributed capacitance energy absorption device, and also implement the quick disassembly and assembly of the capacitor blank and the rapid adjustment of high voltage.

BRIEF DESCRIPTION OF THE DRAWINGS

FIG. 1 is a schematic diagram of a distributed capacitance energy absorption verification device of the present disclosure.

DETAILED DESCRIPTION OF THE EMBODIMENTS

In order to make the objects, technical solutions and advantages of the present disclosure clearer, the following will describe the present disclosure in detail in conjunction with accompany drawings and embodiments. It should be understood that the specific embodiments described here are only used to explain the present disclosure, but not used to limit the present disclosure. Further, the technical features involved in various embodiments of the present disclosure described below may be combined with each other as long as they do not constitute a conflict with each other.

As shown in FIG. 1, a distributed capacitance energy absorption verification device of the present disclosure includes a direct-current high-voltage generator 1, a high-voltage switch 2, a high-voltage capacitor bank 3, an isolation transformer 4, an energy absorption device 5, and a high-voltage sphere gap short-circuit switch 6, wherein the direct-current high-voltage generator 1 charges the high-voltage capacitor bank 3 through the high-voltage switch 2 and stores electrical energy, and at this time, positive electrode potentials of the high-voltage switch 2, the high-voltage capacitor bank 3, a secondary side of the isolation transformer 4, the energy absorption device 5 and the high-voltage sphere gap short-circuit switch 6 are consistent with that of the direct-current high-voltage generator 1. When the high-voltage capacitor 3 is charged to the same level as a test voltage, the high-voltage switch 2 is disconnected, such that the direct-current high-voltage generator 1 is disconnected from a main circuit, and the high-voltage sphere gap short-circuit switch 6 is triggered; and at this time, the short-circuit current starts from a positive electrode of a pulse capacitor of the high-voltage capacitor bank 3, flows through the energy absorption device 5, and returns to a negative electrode of the high-voltage capacitor bank 3 through the high-voltage sphere gap short-circuit switch 6, and the energy stored in the high-voltage capacitor bank 3 is released. Finally, the energy absorption device 5 is dismantled or short-circuited to repeat charging and discharging processes of the high-voltage capacitor bank 3, and short-circuit currents in the case of serial connection or not serial connection with the energy absorption device 5 are compared, thereby implementing the verification of distributed capacitance energy absorption.

Preferably, the high-voltage capacitor bank includes a detachable or adjustable pulse high-voltage capacitor for adapting a distributed capacitance of a simulated system.

The distributed capacitance energy absorption verification device of the present disclosure is applicable to a distributed capacitance energy absorption under a direct-current high-voltage state, and a direct-current high voltage applied to a distributed capacitance energy absorption device is a positive high voltage or negative high voltage.

A distributed capacitance energy absorption device to be verified includes, but is not limited to, a direct-current reactor, a snubber, or the like.

In the verification process, firstly, the high-voltage switch 2 is kept closed, and the direct-current high-voltage generator 1 provides a direct-current high voltage to charge the high-voltage capacitor bank 3. When the high-voltage capacitor bank 3 is charged to a verification voltage, the high-voltage switch 2 is disconnected, the high-voltage sphere gap short-circuit switch 6 is closed, the energy stored in the high-voltage capacitor bank 3 passes through the energy absorption device 5 and is released through the high-voltage sphere gap short-circuit switch 6, and a short-circuit current and a short-circuit voltage are measured between the energy absorption device 5 and the high-voltage sphere gap short-circuit switch 6. The energy absorption device 5 is dismantled or short-circuited to repeat charging and discharging processes of a pulse capacitor of the high-voltage capacitor bank 3, thereby implementing the performance evaluation of the energy absorption device 5.

A person skilled in the art may easily understand that the foregoing descriptions are merely preferred embodiments of the present disclosure, and are not intended to limit the present disclosure. Within the spirit and principles of the present disclosure, any modifications, equivalent substitutions, improvements, etc., are within the protection scope of the present disclosure.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A distributed capacitance energy absorption verification device, comprising:
   a direct-current high-voltage generator;
   a high-voltage switch, a high-voltage capacitor bank;
   an isolation transformer, an energy absorption device; and
   a high-voltage sphere gap short-circuit switch,
   wherein the direct-current high-voltage generator charges the high-voltage capacitor bank through the high-voltage switch and stores electrical energy, and at this time, positive electrode potentials of the high-voltage switch, the high-voltage capacitor bank, a secondary side of the isolation transformer, the energy absorption device and the high-voltage sphere gap short-circuit switch are consistent with that of the direct-current high-voltage generator; when the high-voltage capacitor is charged to the same level as a test voltage, the high-voltage switch is disconnected, such that the direct-current high-voltage generator is disconnected from a main circuit, and the high-voltage sphere gap short-circuit switch is triggered; at this time, the short-circuit current starts from a positive electrode of a pulse capacitor of the high-voltage capacitor bank, flows through the energy absorption device, and returns to a negative electrode of the high-voltage capacitor bank through the high-voltage sphere gap short-circuit switch, and the energy stored in the high-voltage capacitor bank is released; and finally, the energy absorption device is dismantled or short-circuited to repeat charging and discharging processes of the high-voltage capacitor bank, and short-circuit currents in the case of serial connection or not serial connection with the energy absorption device are compared, thereby implementing the verification of distributed capacitance energy absorption.

2. The distributed capacitance energy absorption verification device according to claim 1, wherein the distributed capacitance energy absorption verification device is applicable to the distributed capacitance energy absorption verification under a direct-current high-voltage state, and a direct-current high voltage applied to the distributed capacitance energy absorption verification device is a positive high voltage or negative high voltage.

3. The distributed capacitance energy absorption verification device according to claim 1, wherein a distributed capacitance energy absorption device to be verified is a direct-current reactor or a snubber.

4. The distributed capacitance energy absorption verification device according to claim 1, wherein the high-voltage capacitor bank comprises a detachable or adjustable pulse high-voltage capacitor for adapting a distributed capacitance of a simulated system.

\* \* \* \* \*